US008343820B2

(12) United States Patent
Jung

(10) Patent No.: US 8,343,820 B2
(45) Date of Patent: Jan. 1, 2013

(54) METHOD FOR FABRICATING VERTICAL CHANNEL TYPE NON-VOLATILE MEMORY DEVICE

(75) Inventor: Young-Kyun Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 482 days.

(21) Appl. No.: 12/624,966

(22) Filed: Nov. 24, 2009

(65) Prior Publication Data

US 2011/0059595 A1 Mar. 10, 2011

(30) Foreign Application Priority Data

Sep. 7, 2009 (KR) .................. 10-2009-0084157

(51) Int. Cl.
*H01L 21/00* (2006.01)

(52) U.S. Cl. ........ 438/156; 438/206; 438/209; 438/212; 438/268

(58) Field of Classification Search .............. 438/156, 438/206, 209, 212, 268
See application file for complete search history.

(56) References Cited

U.S. PATENT DOCUMENTS

| 7,539,056 | B2 * | 5/2009 | Katsumata et al. ...... 365/185.18 |
| 8,063,438 | B2 * | 11/2011 | Son et al. ............... 257/328 |
| 2010/0006922 | A1 * | 1/2010 | Matsuoka et al. ......... 257/324 |

FOREIGN PATENT DOCUMENTS

| JP | 2009-117843 | 5/2009 |
| KR | 1020070038233 | 4/2007 |
| KR | 1020090047614 | 5/2009 |

OTHER PUBLICATIONS

Notice of Allowance issued by the Korean Intellectual Property Office on Nov. 30, 2011.

* cited by examiner

*Primary Examiner* — Jae Lee
(74) *Attorney, Agent, or Firm* — IP & T Group LLP

(57) ABSTRACT

A method for fabricating a vertical channel type non-volatile memory device including a plurality of memory cells stacked along channels protruding from a substrate includes: alternately forming a plurality of first material layers and a plurality of second material layers over the substrate; forming a buffer layer over the substrate with the plurality of the first material layers and the plurality of the second material layers formed thereon; forming trenches by etching the buffer layer, the plurality of the second material layers, and the plurality of the first material layers; forming a material layer for channels over the substrate to fill the trenches; and forming the channels by performing a planarization process until a surface of the buffer layer is exposed.

15 Claims, 13 Drawing Sheets

METHOD FOR FABRICATING VERTICAL CHANNEL TYPE NON-VOLATILE MEMORY DEVICE

CROSS-REFERENCE TO RELATED APPLICATIONS

The present application claims priority of Korean Patent Application No. 10-2009-0084157, filed on Sep. 7, 2009, which is incorporated herein by reference in its entirety.

BACKGROUND OF THE INVENTION

The present invention relates to a method for fabricating a semiconductor device, and more particularly, to a method for fabricating a vertical-type non-volatile memory device.

A non-volatile memory device maintains data stored therein although a power source is cut off. As the industry approaches a limitation in improving the integration degree of a two-dimensional memory device, which is fabricated in a single layer over a silicon substrate, a technology of fabricating a non-volatile memory device of a three-dimensional structure by depositing memory cells vertically from a silicon substrate is suggested to overcome the limitation.

Hereafter, a conventional method of fabricating a non-volatile memory device having a three-dimensional structure and problems thereof will be described in detail.

FIGS. 1A to 1D are perspective views illustrating a conventional vertical-type non-volatile memory device.

Referring to FIG. 1A, interlayer dielectric layers 11 and a conductive layer 12 for a gate electrode are alternately formed to form a lower selection transistor (LST) over a substrate 10 with a source region S, and the interlayer dielectric layers 11 and the conductive layer 12 for a gate electrode are etched to expose the source region S.

Subsequently, a gate insulation layer (not shown) is formed on the internal walls of trenches for channels. The trenches for channels are filled with a material layer for channels to thereby form channels CH. Through this process, the LST is fabricated.

Subsequently, over the substrate with the LST formed thereon, a plurality of interlayer dielectric layers 13 and a plurality of conductive layers 14 for a gate electrode are alternately formed to form a plurality of memory cells MC.

Subsequently, the interlayer dielectric layers 13 and the conductive layers 14 for a gate electrode are etched to form trenches for channels that expose the channels CH of the LST. Subsequently, a charge blocking layer, a charge trapping layer, and a tunnel insulation layer (not shown) are formed on the internal walls of the trenches for channels, and then channels CH of memory cells MC integrated with the channels CH of the LST are formed. As a result, a plurality of memory cells MC stacking along the channels CH are formed.

Referring to FIG. 1B, the interlayer dielectric layers 11 and 13 and the conductive layers 12 and 14 for gate electrodes with the LST and the memory cells MC are etched to thereby separate a plurality of memory blocks one from another.

In the drawing, the interlayer dielectric layers etched during the memory block separation process are denoted with reference numerals 11A and 13A, while the conductive layers for gate electrodes etched during the memory block separation process are denoted with reference numerals 12A and 14A.

Referring to FIG. 1C, the etched interlayer dielectric layers 11A and 13A and the etched conductive layers 12A and 14A for gate electrodes of the memory blocks MB are patterned in step-index to expose the surface of each etched conductive layer 12A or 14A for a gate electrode. In the drawing, the plurality of the interlayer dielectric layers patterned in step-index are denoted with reference numerals 11B and 13B, and the conductive layers for gate electrodes patterned in step-index are denoted with reference numerals 12B and 14B.

The process of patterning the plurality of the interlayer dielectric layers 11B and 13B and the conductive layers 12B and 14B for gate electrodes is referred to as a slimming process. The slimming process is performed to expose the surface of the plurality of the patterned conductive layers 12B and 14B for gate electrodes to form contact plugs connected to the surface of the plurality of the patterned conductive layers 12B and 14B for gate electrodes in a subsequent process.

According to the slimming process, an etch process is performed using photoresist patterns that expose the regions reserved for contact plugs, while covering memory cell regions to function as etch barriers. The etch process is repeatedly performed while gradually decreasing the width of the photoresist patterns. Through the process, the plurality of the patterned interlayer dielectric layers 11B and 13B and the patterned conductive layers 12B and 14B for gate electrodes are patterned in step-index.

Herein, the width of the first photoresist pattern conductive layer for a gate electrode is formed to have a width as wide as to expose the regions for contact plugs of the lowermost conductive layer 12B for a gate electrode while covering all memory cell regions stacked over the substrate. The etch process is repeatedly performed under the same conditions while decreasing the width of the photoresist patterns as much as the width of the regions for contact plugs. Since the etch process is performed repeatedly while maintaining the etch step height among the plurality of the stacked memory cells, both sidewalls of the memory blocks MB are patterned in step-index.

Through the slimming process, the patterned conductive layers 12B and 14B for gate electrodes are exposed in each layer.

Referring to FIG. 1D, a conductive layer 16 for a gate electrode and an interlayer dielectric layer 15 are formed over the plurality of the memory blocks patterned in step-index in order to form an upper selection transistor (UST). Then, the interlayer dielectric layer 15 and the conductive layer 16 for a gate electrode are etched to form trenches for channels that expose the channels CH of the memory cells MC.

Subsequently, after a gate insulation layer (not shown) is formed on the internal walls of the trenches for channels, the trenches are filled with a layer for channels to thereby form channels CH of the UST integrated with the channels CH of the memory cells MC. Through this process, the UST is formed.

As a result of the processes, a string is formed of a plurality of memory cells MC connected in series between the LST and the UST. In other words, the string is arrayed vertically with respect to the substrate 10.

The conventional technology described above, however, may have a problem while the trenches for channels are formed because the LST, the memory cells MC and the UST are sequentially formed. Hereafter, problems that may occur during the fabrication of a conventional vertical channel type non-volatile memory device will be described in detail with reference to the accompanying drawings.

FIGS. 2A to 2C are cross-sectional views illustrating a process for fabricating a conventional vertical channel type non-volatile memory device. For the sake of convenience in description, the focus of illustration will be put on the process of forming a plurality of memory cells and the UST, and the other processes and some layers are omitted.

Referring to FIG. 2A, a plurality of interlayer dielectric layers 21 and a conductive layer 22 for a gate electrode are formed over a substrate 20 and the LST is formed through a predetermined process. Herein, since the method for forming the LST is the same as the method described with reference to FIG. 1A, the description will be omitted herein.

Subsequently, a plurality of interlayer dielectric layers 23 and a plurality of conductive layers 24 for gate electrodes are alternately formed to form a plurality of memory cells MC over the substrate with the LST formed thereon. The interlayer dielectric layers 23 and the conductive layers 24 for gate electrodes are etched to thereby form trenches that expose channels CH of the LST.

Herein, over-etch is performed to sufficiently expose the channels CH of the LST. During the over-etch, the surface of the channels CH of the LST is etched in a predetermined thickness. Subsequently, a material layer 25 for channels is formed over the substrate with the trenches formed therein.

Referring to FIG. 2B, a planarization process is performed until the surface of the uppermost interlayer dielectric layer 23 is exposed. By doing so, channels CH of the plurality of the memory cells MC connected to the channels CH of the LST are formed, and the plurality of the memory cells MC are formed to be stacked along the channels (CH) protruded from the substrate 20.

However, the uppermost interlayer dielectric layer 23 is partially etched during the planarization process. In the drawing, the uppermost interlayer dielectric layer damaged during the planarization process is denoted with reference numeral 23A.

Referring to FIG. 2C, a slimming process is performed onto the substrate with the LST and the plurality of the memory cells MC formed thereon. In the drawing, the plurality of the interlayer dielectric layers obtained after the slimming process are denoted with reference numerals 21A and 23A, and the conductive layers for gate electrodes obtained after the slimming process are denoted with reference numerals 22A and 24A. Also, the uppermost interlayer dielectric layer damaged during the planarization process is denoted with reference numeral 23B.

Subsequently, a plurality of interlayer dielectric layers 26 and a conductive layer 27 for a gate electrode are formed to form a UST over the substrate obtained after the slimming process.

Subsequently, trenches for exposing the surface of the channels of the memory cells MC are formed by etching the plurality of the interlayer dielectric layers 26 and the conductive layer 27 for a gate electrode. Herein, over-etch is performed to sufficiently expose the channels CH of the memory cells MC, and the channels CH of the memory cells MC are etched by a predetermined thickness as well during the over-etch.

Since overlay margins become insufficient as the integration degree of a memory device increases, mask patterns used for the formation of trenches may be misaligned with regions where the trenches are to be formed.

In other words, although the trenches for channels of the UST have to be formed at regions aligned with the channels CH of the memory cells MC formed in the lower part, the lack of overlay margins may cause the trenches for channels of the UST to be misaligned with the channels CH of the memory cells MC. Therefore, there is a problem in that the conductive layer 24A for a gate electrode of the memory cells MC formed in the lower part is exposed.

Subsequently, the channels CH of the UST are formed by forming a material layer for channels over the substrate with the trenches formed therein, and performing a planarization process until the surface of the uppermost interlayer dielectric layer 26 is exposed.

However, when the conductive layer 24A for a gate electrode of the memory cells MC is exposed by the misalignment during the formation of the trenches for channels of the UST, the channel CH of the UST contacts (see region 1 of FIG. 2C) the conductive layer 24A for a gate electrode of the memory cells MC. As a result of this contact, a short-induced defect may occur.

In this specification, problems occurring when the UST is formed after a plurality of memory cells MC are formed have been described. However, such problems may also occur when a plurality of memory cells MC are formed after the LST is formed.

Also, although the present specification describes problems occurring when memory cells MC are formed by stacking a plurality of interlayer dielectric layers and a conductive layer for a gate electrode over a substrate, the same problems may occur in the middle of a process for fabricating a vertical channel type non-volatile memory device by sequentially forming an LST, a plurality of memory cells MC, and the UST.

For example, the same problems may occur in a process of fabricating a vertical-type non-volatile memory device including a plurality of memory cells stacked along channels by stacking a plurality of interlayer dielectric layer and a sacrificial layer over a substrate to thereby form the channels and selectively removing the sacrificial layer to thereby sequentially form a tunnel insulation layer, a charge trapping layer, a charge blocking layer, and a conductive layer for a gate electrode in a region from which the sacrificial layer is removed.

Meanwhile, when trenches for channels are formed, a plurality of trenches are formed by one-time etch. However, although the etch process is performed simultaneously under the same conditions, the etch depth becomes different according to a region where a trench is to be formed, a pattern density of the surrounding area and the like. This is called a loading effect. In short, some of the plurality of the trenches may be under-etched lower than a target depth and some others may be over-etched.

For instance, when trenches for channels of the UST are formed, over-etch is performed to sufficiently expose the channels CH of the memory cells MC. Herein, over-etch is performed in consideration of the loading effect so that all trenches are etched more than a target depth, that is, the channels CH of the memory cells MC could be sufficiently etched. Therefore, the probability that the conductive layer for a gate electrode of the memory cells MC is exposed increases.

SUMMARY OF THE INVENTION

Some embodiments of this disclosure are directed to a method for fabricating a vertical channel type non-volatile memory device that is appropriate for preventing a short-induced defect between channels and a gate electrode.

In accordance with an embodiment, there is provided a method for fabricating a vertical channel type non-volatile memory device including a plurality of memory cells stacked along channels protruding from a substrate, which includes: alternately forming a plurality of first material layers and a plurality of second material layers over the substrate; forming a buffer layer over the substrate with the plurality of the first material layers and the plurality of the second material layers formed thereon; forming trenches by etching the buffer layer, the plurality of the second material layers, and the plurality of the first material layers; forming a material layer for channels over the substrate to fill the trenches; and forming the channels by performing a planarization process until a surface of the buffer layer is exposed.

In accordance with another embodiment, there is provided a method for fabricating a vertical channel type non-volatile memory device including a plurality of memory cells stacked along channels protruding from a substrate, which includes: alternately forming a plurality of interlayer dielectric layers and a conductive layer for a gate electrode over the substrate; forming a buffer layer over the substrate with the plurality of the interlayer dielectric layers and the conductive layer for a gate electrode formed thereon; forming trenches which expose a surface of the substrate by etching the buffer layer, the conductive layer for a gate electrode, and the plurality of the interlayer dielectric layers; sequentially forming a charge blocking layer, a charge capturing layer, and a tunnel insulation layer on internal walls of the trenches; forming a material layer for channels over the substrate to fill the trenches after forming the charge blocking layer, the charge capturing layer, and the tunnel insulation layer on the internal walls of the trenches; forming the channels by performing a planarization process until a surface of the buffer layer is exposed; and removing the buffer layer.

DESCRIPTION OF SPECIFIC EMBODIMENTS

Figure 1A:
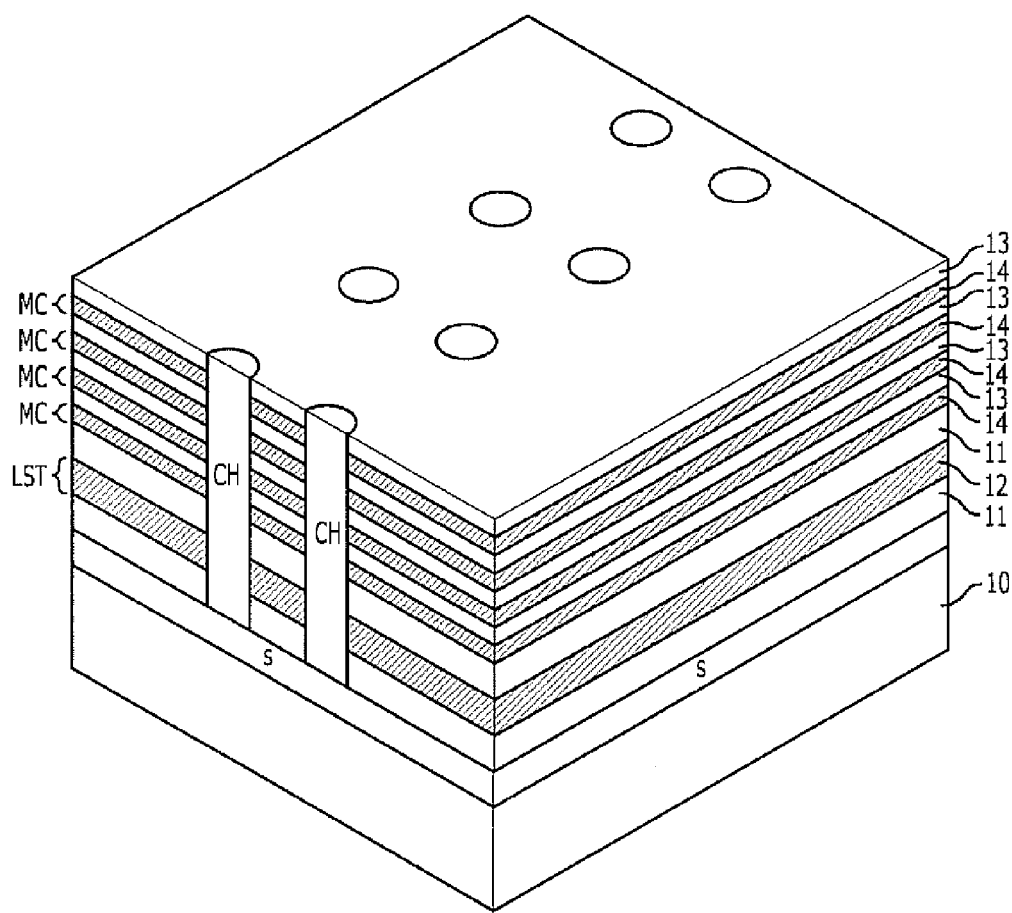
FIGS. 1A to 1D are perspective views illustrating a conventional vertical-type non-volatile memory device.
Figure 1B:
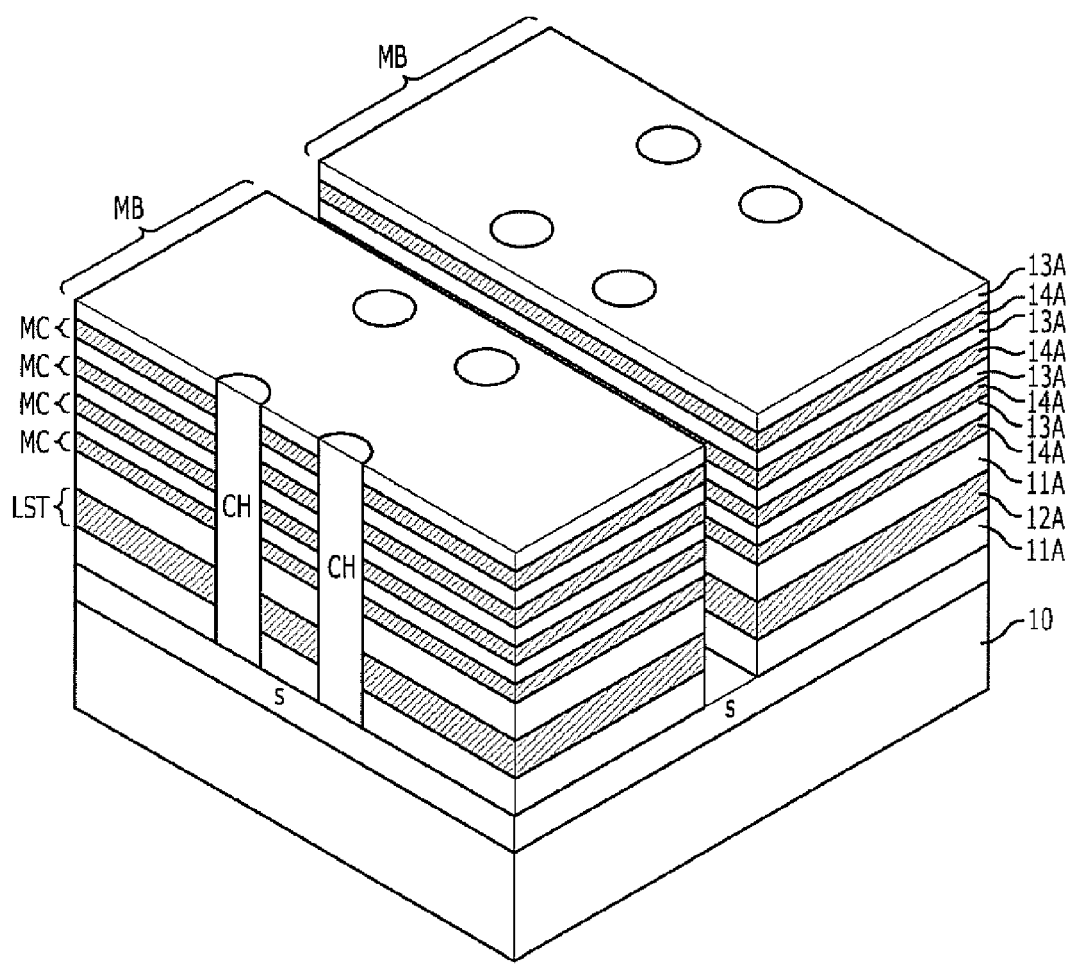
Figure 1C:
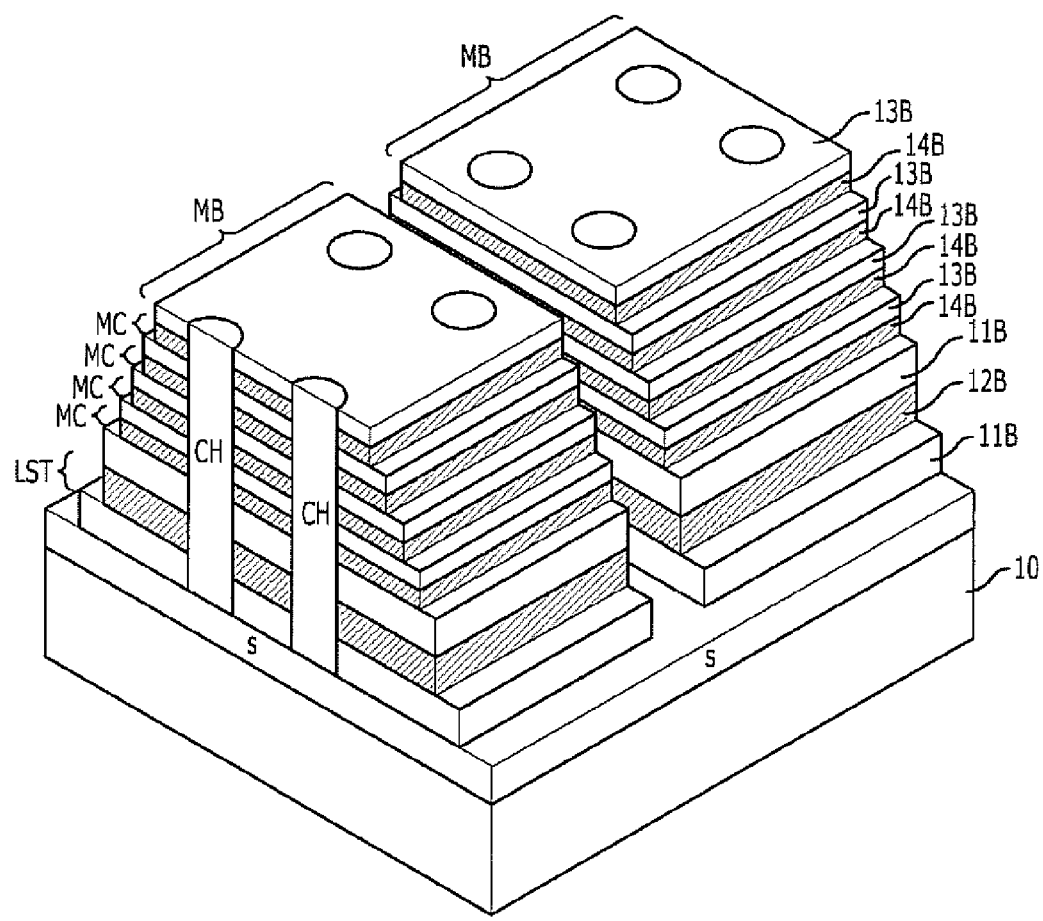
Figure 1D:
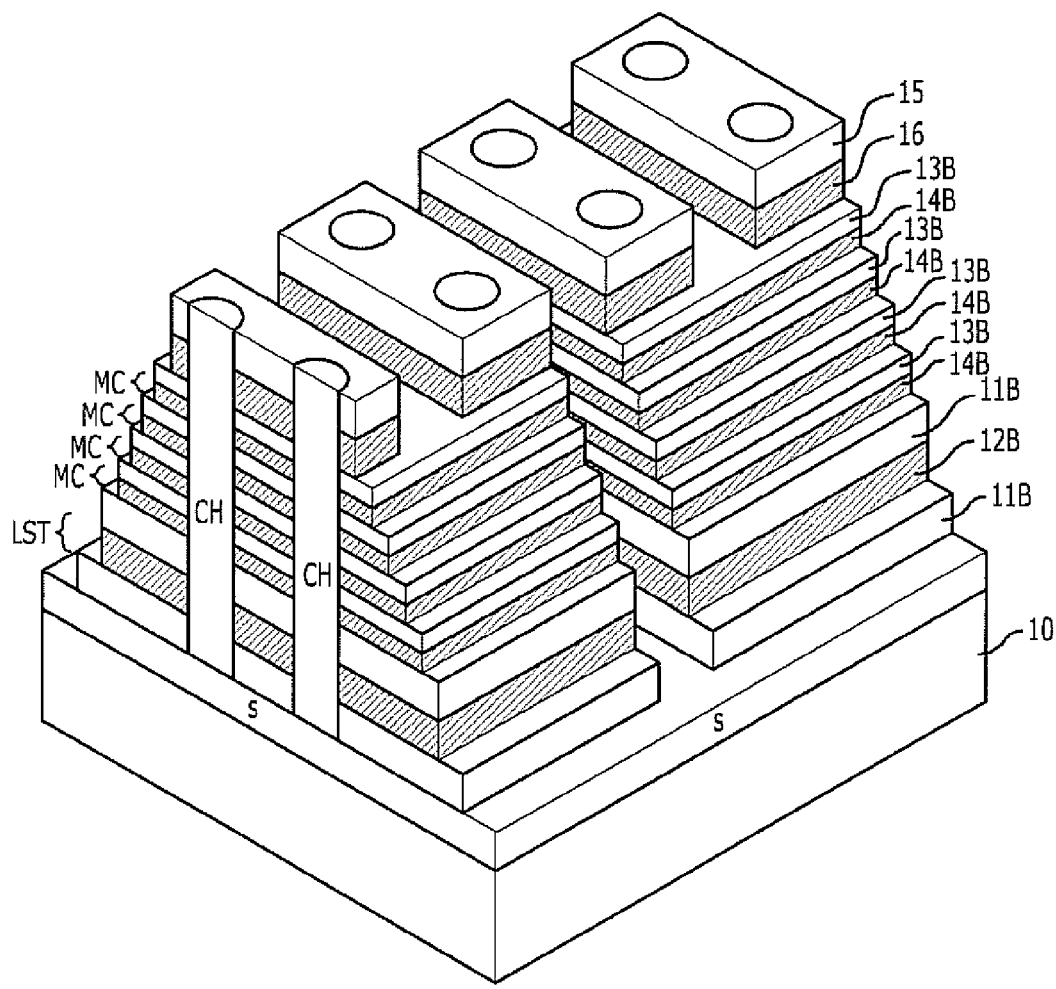
Figure 2A:
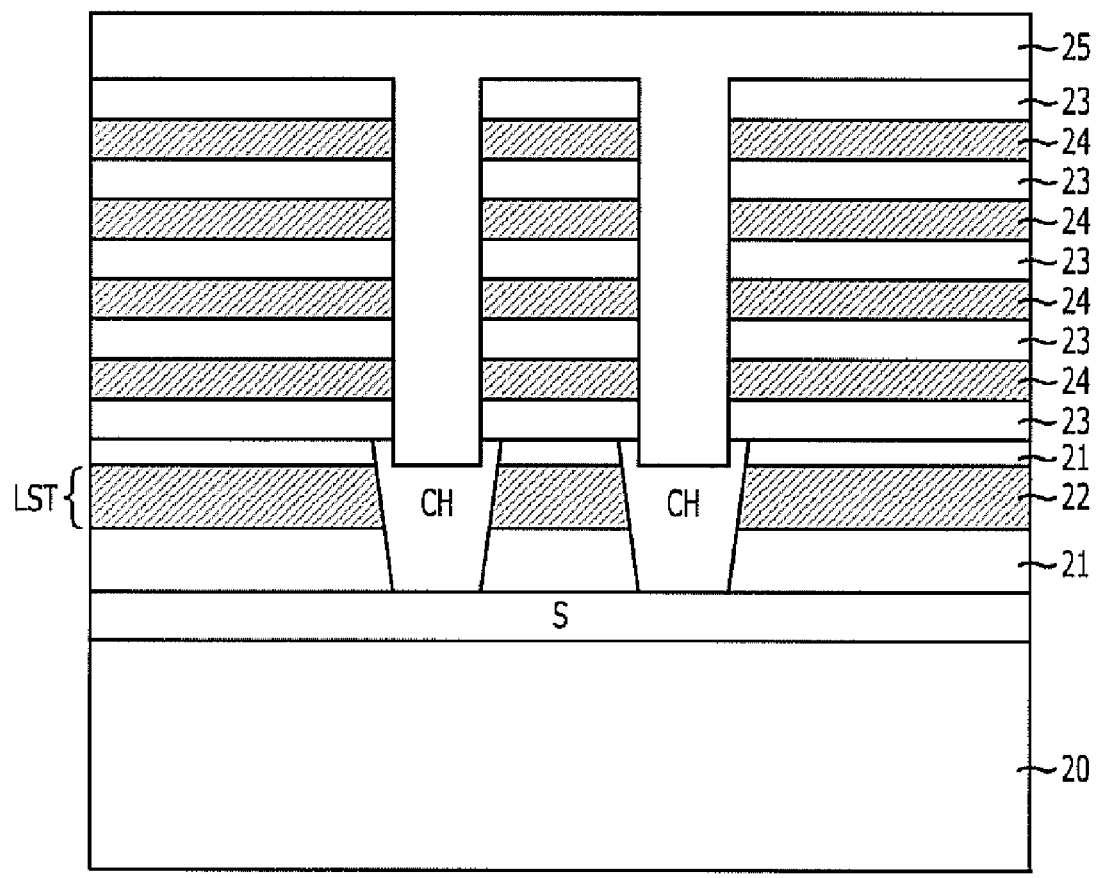
FIGS. 2A to 2C are cross-sectional views illustrating a process for fabricating a conventional vertical channel type non-volatile memory device.
Figure 2B:
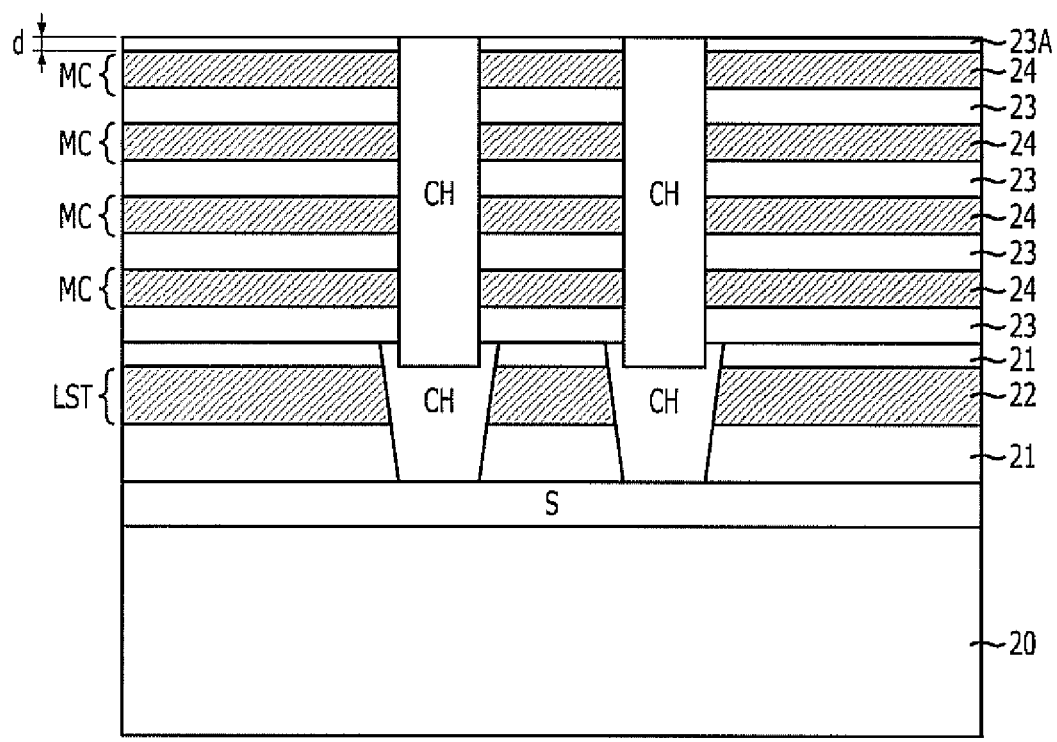
Figure 2C:
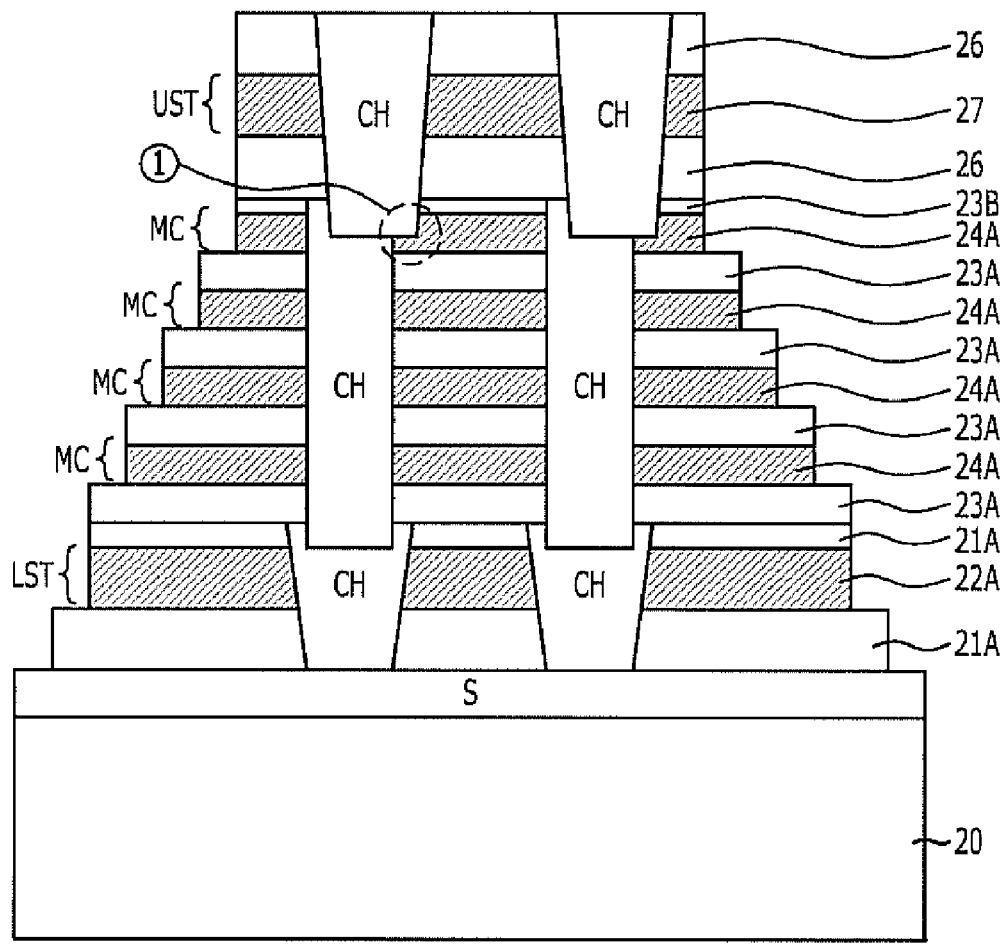

Other objects and advantages of the present invention can be understood by the following description, and become apparent with reference to the embodiments of the present invention.

Referring to the drawings, the illustrated thickness of layers and regions may have been exaggerated to facilitate explanation. When a first layer is referred to as being "on" a second layer or "on" a substrate, it could mean that the first layer is formed directly on the second layer or the substrate, or it could also mean that a third layer may exist between the first layer and the second layer or the substrate. Furthermore, the same or like reference numerals represent the same or like constituent elements, although they appear in different embodiments or drawings of the present invention.

Figure 3A:
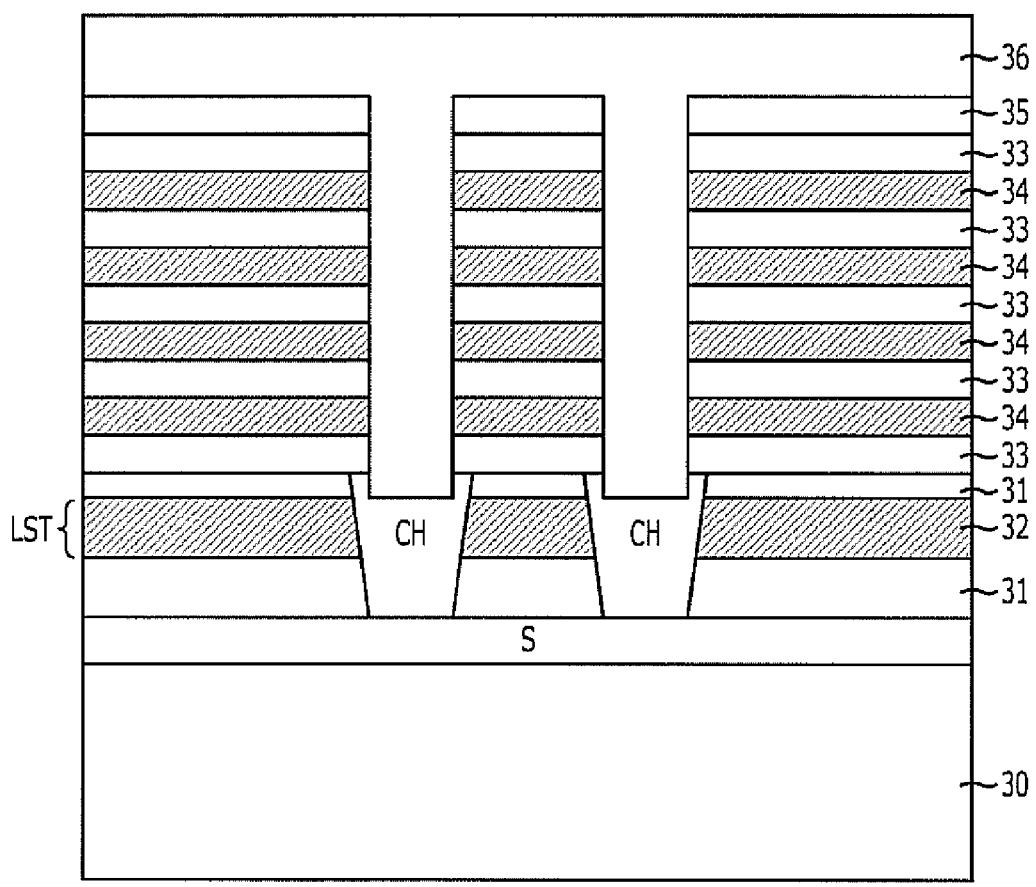
FIGS. 3A to 3C are cross-sectional views describing a method for fabricating a vertical channel type non-volatile memory device in accordance with a first embodiment.
Figure 3B:
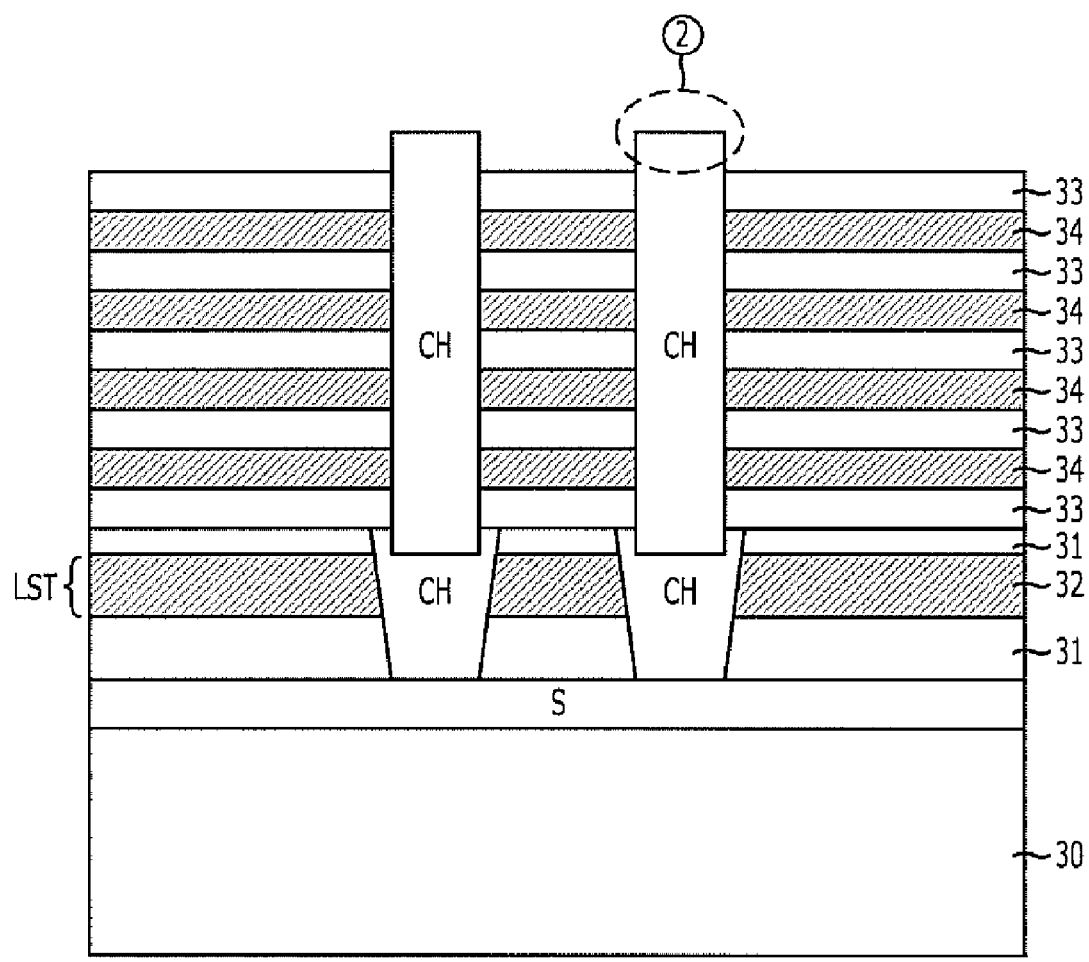
Figure 3C:
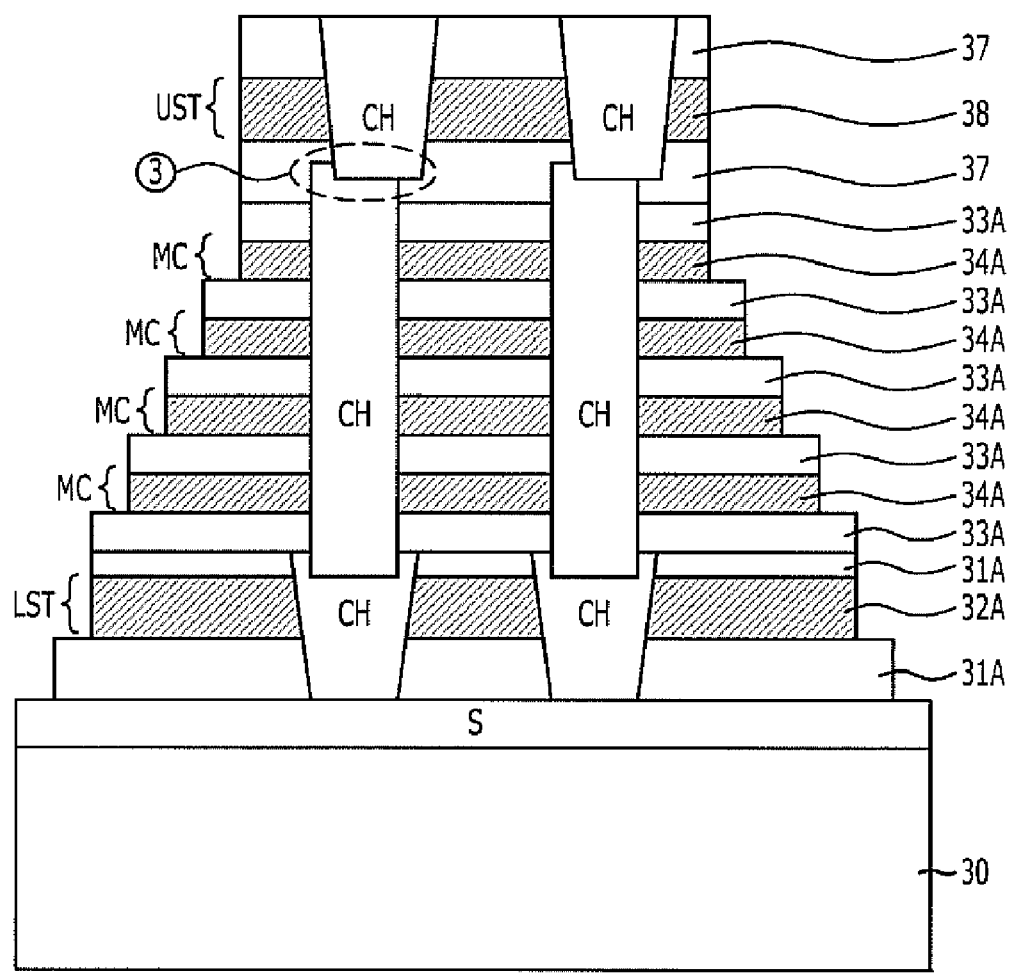

FIGS. 3A to 3C are cross-sectional views describing a method for fabricating a vertical channel type non-volatile memory device in accordance with a first embodiment.

Referring to FIG. 3A, a plurality of interlayer dielectric layers 31 and a conductive layer 32 for a gate electrode are alternately formed over a substrate 30 with a source region S to form a lower part selection transistor (LST). The interlayer dielectric layers 31 and the conductive layer 32 for a gate electrode are etched to form trenches that expose the source region S.

Subsequently, a gate insulation layer (not shown) is formed on the internal walls of the trenches. To be specific, a material layer for gate insulation is formed over the substrate with the trenches formed therein, and the gate insulation layer is formed on the internal walls of the trenches by performing an etch-back process to expose the substrate through the trenches.

Subsequently, channels CH of the LST are formed by filling the trenches for channels having the gate insulation layer formed therein with a material layer for channels. As a result, the LST is formed.

Subsequently, a plurality of first material layers 33 and a plurality of second material layers 34 are alternately formed over the substrate with the LST formed thereon in order to form a plurality of memory cells stacked along the channels protruded from the substrate 30.

Herein, the number of the first material layers 33 and the number of the second material layers 34 are determined based on the number of memory cells to be stacked. The drawing illustrates a case where four memory cells are stacked as an embodiment. However, this is for the sake of convenience in description and the integration degree may be improved by increasing the number of the first material layers 33 and the second material layers 34 stacked thereon.

However, as the number of the first material layers 33 and the second material layers 34 stacked thereon increases, the etch depth during the formation of the trenches becomes deeper. This raises the procedural difficulty. Therefore, a process of forming a plurality of memory cells MC may be divided and performed several times. For example, when 20 memory cells MC are to be stacked, four memory cells MC are formed at once and a process of forming four memory cells MC is repeated 5 times to thereby form 20 memory cells MC.

The first material layers 33 and the second material layers 34 may be formed of diverse materials according to the method for forming the memory cells MC. In the present embodiment, a case where the first material layers 33 are interlayer dielectric layers and the second material layers 34 are conductive layers for gate electrodes is described.

For example, when the first material layers 33 are interlayer dielectric layers, it is desirable to form the first material layers 33 as oxide layers, because they are used for separating the memory cells MC stacked along the channels one from another. The first material layers may have a thickness ranging from approximately 100 Å to approximately 1,000 Å.

When the second material layers 34 are conductive layers for gate electrodes, it is desirable to form the second material layers 34 as polysilicon layers, because they are used for forming gate electrodes of the respective memory cells MC. Also, the second material layers 34 may have a thickness ranging from approximately 100 Å to approximately 1,000 Å.

Subsequently, a buffer layer 35 is formed over the substrate with the first material layers 33 and the second material layers 34 all formed thereon. Herein, the buffer layer 35 is used as a sort of a stop layer for stopping a subsequent planarization process. This process may prevent the first material layers 33 formed in the uppermost part during a subsequent planarization process.

The buffer layer 35 may be formed of a $Si_3N_4$, $SiO_2$, Plasma Enhanced TetraEthyl OrthoSilicate (PETEOS), phosphorous silicate glass (PSG), undoped silicate glass (USG), or high-density plasma (HDP) oxide layer. Also, the buffer layer 35 may have a thickness ranging from approximately 100 Å to approximately 1,000 Å.

Subsequently, trenches are etched to expose the channels of the LST by etching the buffer layer 35, the plurality of the first material layers 33, and the plurality of the second material layers 34. Herein, over-etch may be performed to sufficiently expose the channels of the LST.

Subsequently, a charge blocking layer, a charge capturing layer, and a tunnel insulation layer (not shown) are formed on the internal walls of the trenches. For example, the charge blocking layer, the charge capturing layer, and the tunnel insulation layer are sequentially formed over the substrate with the trenches formed therein. The charge blocking layer, the charge capturing layer, and the tunnel insulation layer remain on the internal walls of the trenches by performing an etch-back process. Also, the etch-back process may be performed after a protective layer is formed over the tunnel insulation layer in order to prevent the tunnel insulation layer from being damaged during the etch-back process.

Herein, the charge blocking layer prevents charges from passing through the charge capturing layer and transferring toward the gate electrode. The charge capturing layer is used as a data storage. The charge capturing layer includes a charge storing layer for storing charges within a conductive band or a charge trapping layer for trapping charges in a deep potential trap site. The tunnel insulation layer is provided as an energy barrier layer based on a tunneling of charges.

Subsequently, a material layer 36 for channels is formed over the resultant substrate to fill the trenches. Herein, the material layer 36 for channels may be a monocrystalline silicon layer or a polycrystalline silicon layer.

For example, when the material layer 36 for channels is a polycrystalline silicon layer, laser annealing process may be performed after the material layer 36 for channels is formed. When the laser annealing process is performed, the material layer 36 for channels is selectively crystallized or re-crystallized. Therefore, the layer quality of the material layer 36 for channels may be efficiently improved while not damaging other layers.

Referring to FIG. 3B, a planarization process is performed until the surface of the buffer layer 35 is exposed. Since the planarization process is performed while the uppermost first material layer 33 is protected by the buffer layer 35, the first material layer 33 is not damaged. In other words, since the first material layer 33 maintains its initial thickness, a subsequent slimming process may be performed easily.

As a result of the above-described processes, the channels CH of the plurality of the memory cells MC are formed and the plurality of the memory cells MC are stacked along the channels CH.

Subsequently, the buffer layer 35 is removed. Since the planarization process is performed until the surface of the buffer layer 35 is exposed, the channels CH are protruded upon the removal of the buffer layer 35 (see region 2 of FIG. 3B). In other words, the channels CH are protruded from the surface of the first material layer 33 as much as the thickness of the buffer layer 35.

Herein, the buffer layer 35 may be removed through a wet dip-out process or a dry etch process. For example, when the buffer layer 35 includes a nitride layer, it is desirable to remove the buffer layer 35 through a wet dip-out process using phosphoric acid.

Further, although not illustrated in the drawing, a plurality of memory blocks are separated by etching the plurality of the first material layer 33, the plurality of the second material layer 34, the interlayer dielectric layer 31, and the conductive layer 32 for a gate electrode. Of course, it is possible to perform the memory block separation process before the removal of the buffer layer 35 or after the removal of the buffer layer 35.

Referring to FIG. 3C, a slimming process for etching the plurality of the first material layer 33, the plurality of the second material layer 34, the interlayer dielectric layer 31, and the conductive layer 32 for a gate electrode is performed to expose the surface of each second material layer 34. Of course, the slimming process may be performed before the removal of the buffer layer 35 or after the removal of the buffer layer 35.

In the drawing, the interlayer dielectric layer for the LST obtained after the slimming process is denoted with reference numeral 31A, and the conductive layer for a gate electrode obtained after the slimming process is denoted with reference numeral 32A. Also, the first material layers for memory cells MC obtained after the slimming process are denoted with reference numeral 33A, and the second material layers are denoted with reference numeral 34A.

Herein, the slimming process is an etch process performed using a photoresist pattern that exposes regions reserved for contact plugs, while covering the regions for memory cells MC to function as an etch barrier. The plurality of the first material layers 33A and the plurality of the second material layers 34A are patterned in step-index by repeatedly performing the etch process under the same conditions while gradually reducing the width of the photoresist pattern.

In other words, the plurality of the first material layers 33A and the plurality of the second material layers 34A should maintain the same thickness as a result of the slimming process. According to the embodiment of this disclosure, since the buffer layer 35 protects the uppermost first material layer 33A from being damaged, the plurality of the first material layers 33A and the plurality of the second material layers 34A can maintain the same thickness. In short, the embodiment of this disclosure may make the slimming process easier as the etch step height among the memory cells are maintained the same.

Subsequently, a plurality of interlayer dielectric layers 37 and a conductive layer 38 for a gate electrode are formed over the substrate with the plurality of the memory cells MC formed thereon to form an upper selection transistor (UST).

Herein, the thickness of the interlayer dielectric layers 37 may be determined in consideration of the height of the protruded channels CH of the memory cells MC. In other words, the interlayer dielectric layers 37 may be formed as thick as to sufficiently cover the protruded channels CH.

Subsequently, trenches are formed to sufficiently expose the channels CH of the memory cells MC by etching the plurality of the interlayer dielectric layers 37 and a conductive layer 38 for a gate electrode. Herein, over-etch may be performed to sufficiently expose the channels CH of the memory cells MC.

According to the embodiment, a buffer layer 35 protects the uppermost first material layer 33A from being damaged during the planarization process, so that even the over-etch does not expose the conductive layer for a gate electrode in the lower part.

Moreover, since the channels CH of the memory cells MC protrude from the surface of the first material layer 33A to a predetermined height, margins for the etching may be as much as the height of the protrusions of the channels CH. In particular, although over-etch is performed in consideration of etch depth difference based on the loading effect, the conductive layer for a gate electrode in the lower part may be protected from being exposed because the margins for etching are as much as the height of the protrusions of the channels CH.

Subsequently, after a gate insulation layer (not shown) is formed on the internal walls of trenches, a material layer for channels is formed over the resultant substrate. Then, a planarization process is performed until the surface of the uppermost interlayer dielectric layer 37 is exposed to thereby form the channels CH of a UST.

As a result, a string formed of a plurality of memory cells MC connected in series is formed between the LST and the UST.

Figure 4A:
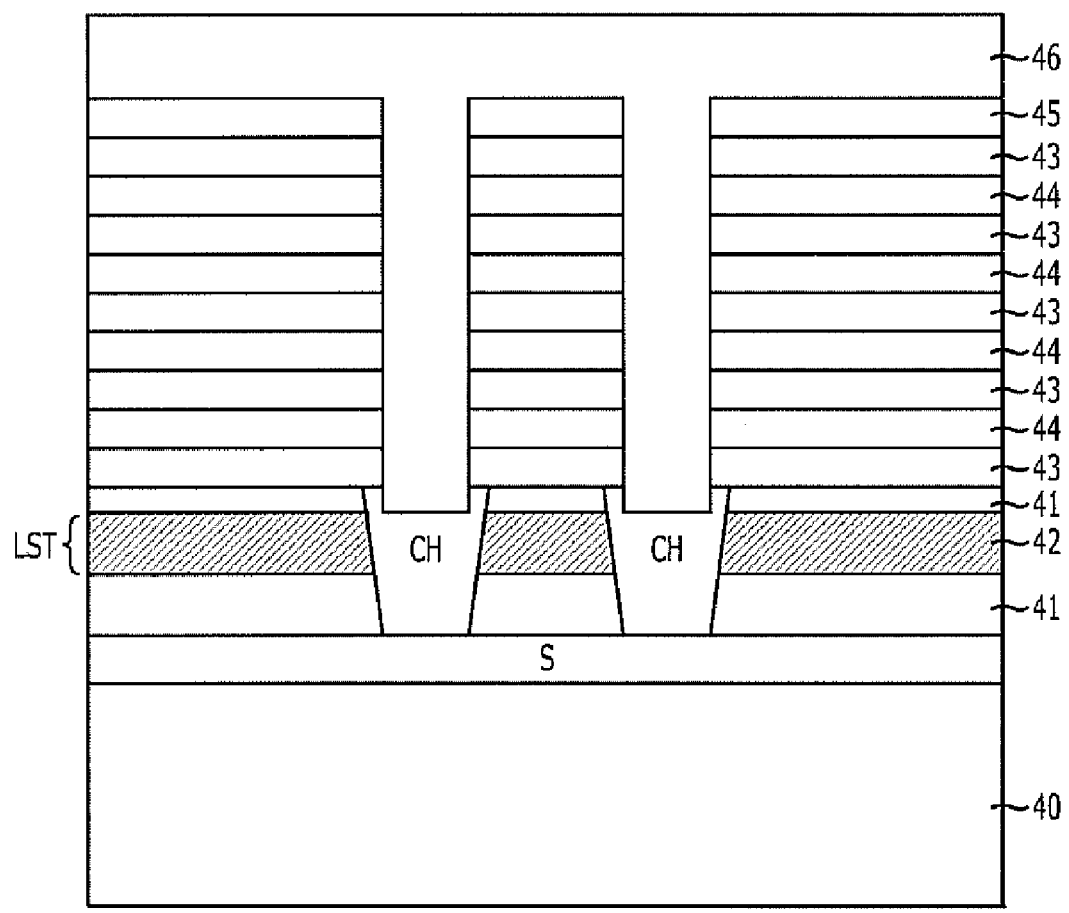
FIGS. 4A to 4C are cross-sectional views describing a method for fabricating a vertical channel type non-volatile memory device in accordance with a second embodiment.
Figure 4B:
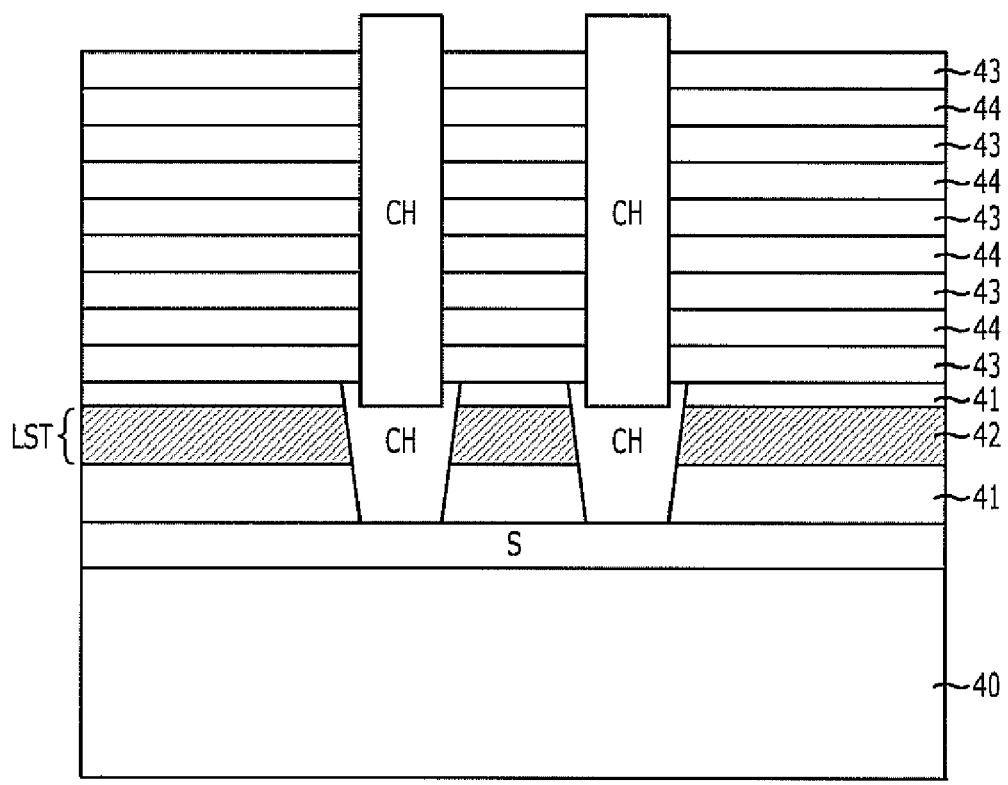
Figure 4C:
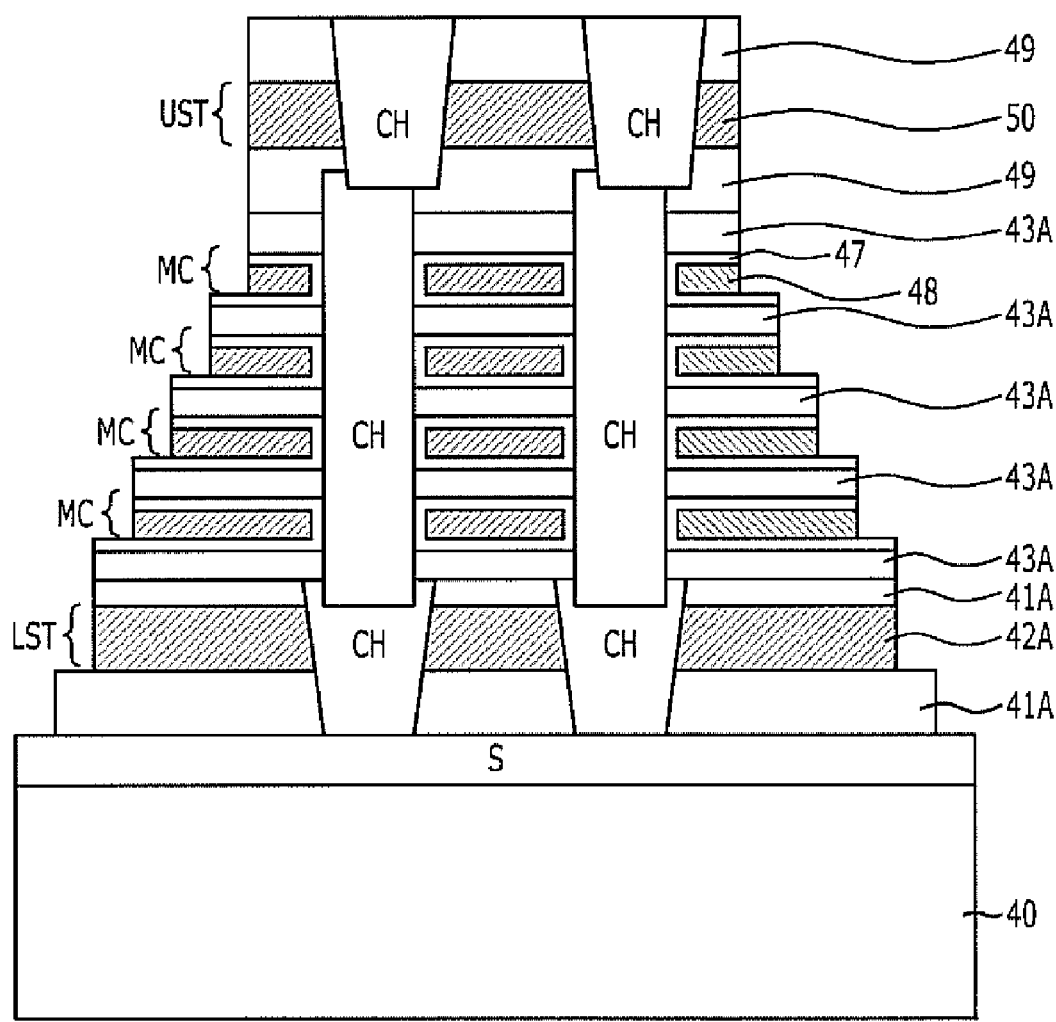

FIGS. 4A to 4C are cross-sectional views describing a method for fabricating a vertical channel type non-volatile memory device in accordance with a second embodiment. Herein, what has been described in the explanation with reference to FIG. 1 is omitted.

Referring to FIG. 4A, a plurality of interlayer dielectric layers 41 and a conductive layer 42 are alternately formed to form an LST over a substrate 40 with a source region S. Since the specific process for forming the LST is the same as that described with reference to FIG. 1, the description will be omitted herein.

Subsequently, a plurality of first material layers 43 and a plurality of second material layers 44 are alternately formed over the substrate with the LST formed thereon in order to form a plurality of memory cells MC stacked along the channels protruding from the substrate 40.

Herein, the first material layers 43 and the second material layers 44 may be formed of diverse materials according to a method for forming the memory cells MC. In this embodiment, a case where the first material layers 43 are interlayer dielectric layers and the second material layers 44 are sacrificial layers will be described.

For example, when the first material layers 43 are interlayer dielectric layers, the first material layers 43 are for separating the plurality of the memory cells MC stacked along the channels one from another. Thus, they may be formed as oxide layers. Also the first material layers 43 may have a thickness of over approximately 100 Å.

When the second material layers 44 are sacrificial layers, the second material layers 44 are for securing a space where a tunnel insulation layer, a charge capturing layer, a charge blocking layer, and a gate electrode of each memory cell are to be formed. Therefore, the second material layers 44 may be formed of a material having a great etch selectivity with respect to the first material layers 43 so that only the second material layers 44 could be selectively removed. For example, the second material layers 44 may be formed as a nitride layer or an amorphous carbon layer and have a thickness of over approximately 100 Å.

Subsequently, after a buffer layer 45 is formed over the substrate with the plurality of the first material layers 43 and the plurality of the second material layers 44, trenches exposing channels CH of the LST are formed by etching the buffer layer 45, the plurality of the first material layers 43, and the plurality of the second material layers 44.

Subsequently, a material layer 46 for channels is formed over the substrate with the trenches to fill the trenches.

Referring to FIG. 4B, a planarization process is performed until the surface of the buffer layer 45 is exposed. As a result, a plurality of channels CH of the memory cells MC are formed.

Subsequently, the buffer layer 45 is removed. The buffer layer 45 may be removed through a wet etch process.

Referring to FIG. 4C, a slimming process for etching the plurality of the first material layers 43 and the plurality of the second material layers 44 is performed to expose the surface of each of the second material layers 44. In the drawing, the interlayer dielectric layer for an LST obtained after the slimming process is marked with reference numeral 41A, and the conductive layer for a gate electrode after the slimming process is marked with reference numeral 42A. Also, the first material layers for the memory cells MC obtained after the slimming process are marked with reference numerals 43A.

Subsequently, the second material layers 44 are selectively removed, without removing the first material layer patterns 43A. The removal of the second material layers 44 creates openings between adjacent first material layer patterns 43A, thereby exposing the sidewalls of the channels CH through the open regions at predetermined intervals.

Subsequently, the tunnel insulation layer, the charge capturing layer, and the charge blocking layer are sequentially formed on the sidewalls of the channels CH exposed at predetermined intervals. In short, the tunnel insulation layer, the charge capturing layer, and the charge blocking layer are sequentially formed along the entire surface of the open region. In the drawing, the tunnel insulation layer, the charge capturing layer, and the charge blocking layer are illustrated as one layer for the sake of convenience in description, and the layer is marked with reference numeral 47.

Subsequently, a conductive layer 48 for a gate electrode is formed over the layer 47 including the tunnel insulation layer, the charge capturing layer, and the charge blocking layer. In other words, the open regions, where the layer 47 including the tunnel insulation layer, the charge capturing layer, and the charge blocking layer is formed, are filled with the conductive layer 48 for a gate electrode. As a result, the plurality of the memory cells MC stacked along the channels CH are formed.

Subsequently, a plurality of interlayer dielectric layers 49 and a conductive layer 50 for a gate electrode are formed to form a UST over the resultant substrate with the plurality of the memory cells MC.

After trenches exposing the channels CH of the memory cells MC are formed by etching the plurality of the interlayer dielectric layers 49 and the conductive layer 50 for a gate electrode, a gate insulation layer (not shown) is formed on the internal walls of the trenches.

Subsequently, a material layer for channels CH is formed over the resultant substrate, and a planarization process is performed until the surface of the uppermost interlayer dielectric layer 49 is exposed to thereby form the channels CH of the UST.

As a result, a string formed of a plurality of memory cells MC connected in series is formed between the LST and the UST.

The present embodiment describes a case where a buffer layer prevents a short-induced defect between the channels CH of the UST and the conductive layer for a gate electrode of the uppermost memory cell when a plurality of memory cells MC are formed. The embodiment, however, describes the case only for the sake of convenience in description and the present invention is not limited to the embodiment.

Besides, the technology of the present embodiment may be applied to a process of forming memory cells MC after the LST is formed. For example, a buffer layer may be formed over the plurality of the interlayer dielectric layers and the conductive layer for a gate electrode for forming the LST. In this case, it is possible to prevent a short-induced defect caused by the channels CH of the memory cells MC contacting the gate electrode of the LST.

As described before, the present embodiment may be applied several times where the process of forming a plurality of memory cells MC is divided into several memory cell group forming processes. For example, when the memory cells MC are formed by performing the process five times, a buffer layer (e.g., a buffer layer such as buffer layer 35 in FIG. 3A except that the buffer layer is not for forming a UST but rather for another memory cell group) is formed for each memory cell group forming process to thereby prevent a short-induced defect from occurring as the channels CH of the memory cells MC formed in the upper part contact the gate electrode of the memory cells MC formed in the lower part.

Particularly, although the memory cells MC are stacked by performing the memory cell forming process several times, the initial thickness of the uppermost interlayer dielectric layers may be maintained because the buffer layer protects the uppermost interlayer dielectric layers in each memory cell forming process. Therefore, the slimming process may be easily performed based on the etch step height between the memory cells MC.

According to the embodiments of this disclosure, damage to an uppermost first material layer during a planarization process may be prevented by forming a buffer layer over the first material layer and a second material layer in the fabrication of a vertical channel type non-volatile memory device. Also, it is possible to prevent a conductive layer for a gate electrode in the lower part from being exposed by forming channels that protrude to a predetermined height from the surface of the first material layer. Further, the protruding channels function to secure margins for etching. Therefore, a short-induced defect does not occur between the channels of an upper selection transistor (UST) and a gate electrode of memory cells.

Particularly, since the buffer layer prevents damage to the uppermost first material layer, the initial thickness of the first material layer may be maintained. Therefore, a slimming process may be easily performed based on etch height among a plurality of memory cells.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a vertical channel type non-volatile memory device including a plurality of memory cells stacked along channels protruding from a substrate, comprising:
    alternately forming a plurality of first material layers and a plurality of second material layers over the substrate;
    forming a buffer layer over the substrate with the plurality of the first material layers and the plurality of the second material layers formed thereon; forming trenches by etching the buffer layer, the plurality of the second material layers, and the plurality of the first material layers;
    forming a material layer for channels over the substrate to fill the trenches;
    forming the channels by performing a planarization process until a surface of the buffer layer is exposed; and
    removing the buffer layer, wherein removing the buffer layer results in the channels protruding by a predetermined height from a surface of an uppermost first material layer.

2. The method of claim 1, wherein the plurality of the first material layers are interlayer dielectric layers, and the plurality of the second material layers are conductive layers for a gate electrode.

3. The method of claim 2, further comprising:
    forming a gate insulation layer on internal walls of the trenches, before forming the material layer for channels.

4. The method of claim 2, further comprising:
    forming a charge blocking layer, a charge capturing layer, and a tunnel insulation layer on internal walls of the trenches, before forming the material layer for channels.

5. The method of claim 1, wherein the plurality of the first material layers are interlayer dielectric layers, and the plurality of the second material layers are sacrificial layers.

6. The method of claim 5, further comprising:
    exposing sidewalls of the channels at a predetermined interval by removing the second material layers, after forming the channels by performing the planarization process;
    sequentially forming the tunnel insulation layer, the charge capturing layer, and the charge blocking layer over the channels exposed at the predetermined interval; and
    forming a conductive layer for a gate electrode over the tunnel insulation layer, the charge capturing layer, and the charge blocking layer.

7. The method of claim 1, further comprising: separating memory blocks by etching the plurality of the first material layers and the plurality of the second material layers, after forming the channels by performing the planarization process; and patterning the plurality of the first material layers and the plurality of the second material layers in step-index to expose a surface of each memory cell.

8. The method of claim 1, further comprising:
    forming a second plurality of first material layers and a second plurality of second material layers over the substrate from which the buffer layer is removed;
    forming second trenches which expose a surface of each channel by etching the second plurality of the first material layers and the second plurality of the second material layers; and
    filling the second trenches with a second material layer for channels.

9. The method of claim 1, further comprising:
    forming a plurality of interlayer dielectric layers and a conductive layer for a gate electrode over the substrate from which the buffer layer is removed;
    forming second trenches which expose a surface of each channel by etching the plurality of the interlayer dielectric layers and the conductive layer; and
    filling the second trenches with a second material layer for channels.

10. The method of claim 1, wherein the buffer layer includes $Si_3N_4$, $SiO_2$, Plasma Enhanced TetraEthyl Ortho-Silicate (PETEOS), phosphorous silicate glass (PSG), undoped silicate glass (USG), or high-density plasma (HDP) oxide layer.

11. A method for fabricating a vertical channel type non-volatile memory device including a plurality of memory cells stacked along channels protruding from a substrate, comprising:
    alternately forming a plurality of interlayer dielectric layers and a conductive layer for a gate electrode over the substrate;
    forming a buffer layer over the substrate with the plurality of the interlayer dielectric layers and the conductive layer for a gate electrode formed thereon;
    forming trenches by etching the buffer layer, the conductive layer for a gate electrode, and the plurality of the interlayer dielectric layers;

sequentially forming a charge blocking layer, a charge capturing layer, and a tunnel insulation layer on internal walls of the trenches;

forming a material layer for channels over the substrate to fill the trenches after forming the charge blocking layer, the charge capturing layer, and the tunnel insulation layer on the internal walls of the trenches;

forming the channels by performing a planarization process until a surface of the buffer layer is exposed; and removing the buffer layer, wherein removing the buffer layer results in the channels protruding by a predetermined height from a surface of an uppermost interlayer dielectric layer.

12. The method of claim 11, further comprising:

alternately forming a plurality of interlayer dielectric layers and a conductive layer for a gate electrode over the substrate from which the buffer layer is removed;

forming trenches which expose a surface of the channels by etching the plurality of the interlayer dielectric layers and the conductive layer for a gate electrode;

forming a gate insulation layer on internal walls of the trenches; and filling the trenches with a material layer for channels.

13. The method of claim 11, wherein the buffer layer includes $Si_3N_4$, SiO, Plasma Enhanced TetraEthyl OrthoSilicate (PETEOS), phosphorous silicate glass (PSG), undoped silicate glass (USG), or high-density plasma (HDP) oxide layer.

14. A method for fabricating a vertical channel type non-volatile memory device including a plurality of memory cells stacked along channels protruding from a substrate, comprising:

forming a lower selection transistor, having channels and a conductive layer between two interlayer dielectric layers, over the substrate;

alternately forming a plurality of first material layers and a plurality of second material layers over the lower selection transistor;

forming a buffer layer over the substrate with the plurality of the first material layers and the plurality of the second material layers formed thereon;

forming trenches which expose a surface of the channels of the lower selection transistor by etching the buffer layer, the plurality of the second material layers, and the plurality of the first material layers;

forming a material layer for memory cell channels to fill the trenches; and forming the memory cell channels by performing a planarization process until a surface of the buffer layer is exposed; and removing the buffer layer, wherein removing the buffer layer results in the channels protruding by a predetermined height from a surface of an uppermost first material layer.

15. The method of claim 14, further comprising:

forming a plurality of interlayer dielectric layers and a conductive layer for a gate electrode over the substrate from which the buffer is removed;

forming second trenches which expose a surface of each memory cell channel by etching the plurality of the interlayer dielectric layers and the conductive layer for the gate electrode; and filling the second trenches with a second material layer for second channels.

* * * * *